(12) United States Patent
Romansky et al.

(10) Patent No.: US 7,176,900 B2
(45) Date of Patent: Feb. 13, 2007

(54) METHOD AND APPARATUS FOR FIELD PROGRAMMING RADIO FREQUENCY IDENTIFICATION DEVICES

(75) Inventors: Brian M. Romansky, Monroe, CT (US); Thomas J. Foth, Trumbull, CT (US); Jeffrey D. Pierce, Sandy Hook, CT (US); Andrei Obrea, Seymour, CT (US); Anand V. Chhatpar, Madison, WI (US)

(73) Assignee: Pitney Bowes Inc., Stamford, CT (US)

( * ) Notice: Subject to any disclaimer, the term of this patent is extended or adjusted under 35 U.S.C. 154(b) by 440 days.

(21) Appl. No.: 10/430,597

(22) Filed: May 7, 2003

(65) Prior Publication Data

US 2004/0074676 A1    Apr. 22, 2004

Related U.S. Application Data

(60) Provisional application No. 60/419,361, filed on Oct. 18, 2002.

(51) Int. Cl.
     *G09G 5/00*      (2006.01)
(52) U.S. Cl. .................................................. 345/173
(58) Field of Classification Search ................ 345/156, 345/173; 178/18.01; 307/116; 235/383, 235/462.15; 340/10.5, 10.6, 5.26
See application file for complete search history.

(56) References Cited

U.S. PATENT DOCUMENTS

| | | | |
|---|---|---|---|
| 4,087,679 A | 5/1978 | Samreus nee Maymarev | |
| 4,889,961 A | 12/1989 | Carlson | |
| 5,444,223 A | * 8/1995 | Blama | 235/435 |
| 5,962,834 A | 10/1999 | Markman | |
| 6,003,770 A | 12/1999 | Schilling | |
| 6,018,299 A | 1/2000 | Eberhardt | |
| 6,104,311 A | 8/2000 | Lastinger | |
| 6,111,506 A | 8/2000 | Yap et al. | |
| 6,436,516 B1 | 8/2002 | Nagashima et al. | |
| 6,480,100 B1 | 11/2002 | Frieden et al. | |
| 6,557,768 B2 | 5/2003 | Yap et al. | |

(Continued)

FOREIGN PATENT DOCUMENTS

DE      19947180 A1      4/2001

(Continued)

*Primary Examiner*—Richard Hjerpe
*Assistant Examiner*—Abbas Abdulselam
(74) *Attorney, Agent, or Firm*—Ronald Reichman; Angelo N. Chaclas (57) ABSTRACT

A system and method that allows one to mark information with a pencil or conductive ink on paper equipped with a RFID type circuit, and have the marked information provided to the RFID circuit, or have the written information cause the RFID circuit to perform some function. The marked entered information may be corrected by erasing the written information with a pencil eraser and writing new information on the paper with a pencil. Information may also be marked into a RFID circuit or have the marked information cause the RFID circuit to perform some function by utilizing a standard ink jet computer printer to print lines on paper equipped with a RFID type circuit, by having the printed lines perform the function of wires. The aforementioned printed information may be modified by having an individual connect different printed wires by drawing a penciled line between the wires or by punching holes in the printed lines.

3 Claims, 6 Drawing Sheets

U.S. PATENT DOCUMENTS

| | | |
|---|---|---|
| 6,628,199 B1 | 9/2003 | Ehrensvärd et al. |
| 6,720,866 B1 * | 4/2004 | Sorrells et al. ............ 340/10.4 |
| 6,724,311 B1 | 4/2004 | Kolton et al. |
| 6,770,509 B2 * | 8/2004 | Halope et al. ............... 438/108 |
| 6,809,628 B1 | 10/2004 | Bensimon et al. |
| 6,825,754 B1 | 11/2004 | Rolin |
| 6,827,279 B2 * | 12/2004 | Teraura ...................... 235/492 |
| 6,836,215 B1 * | 12/2004 | Laurash et al. .......... 340/572.1 |
| 6,893,489 B2 | 5/2005 | Lem et al. |
| 2001/0006194 A1 | 7/2001 | Kayanakis et al. |
| 2003/0205615 A1 | 11/2003 | Marappan |

FOREIGN PATENT DOCUMENTS

| | | |
|---|---|---|
| DE | 20106542 U1 | 7/2001 |
| DE | 10016716 A1 | 8/2001 |
| JP | 2001-256457 * | 9/2001 |
| JP | 02003037522 A | 2/2003 |
| WO | WO 01/91045 A1 | 11/2001 |

* cited by examiner

METHOD AND APPARATUS FOR FIELD PROGRAMMING RADIO FREQUENCY IDENTIFICATION DEVICES

This Application claims the benefit of the filing date of U.S. Provisional Application No. 60/419,361 filed Oct. 18, 2002, which is owned by the assignee of the present Application.

CROSS REFERENCE TO RELATED APPLICATIONS

Reference is made to commonly assigned co-pending patent applications U.S. Pat. No. 6,805,291 filed herewith entitled "METHOD FOR FIELD PROGRAMMABLE RADIO FREQUENCY DOCUMENT IDENTIFICATION DEVICES" in the names of Anand D. Chhatpar, Jeffrey D. Pierce, Brian M. Romansky, Thomas J. Foth, and Andrei Obrea; Ser. No. 10/430,991 filed herewith entitled "METHOD FOR FIELD PROGRAMMING RADIO FREQUENCY IDENTIFICATION DEVICES THAT CONTROL REMOTE CONTROL DEVICES" in the names of Jeffrey D. Pierce, Brian M. Romansky, Thomas J. Foth, and Anand V. Chhatpar; Docket U.S. Pat. No. 5,869,020 filed herewith entitled "METHOD FOR FIELD PROGRAMMABLE RADIO FREQUENCY IDENTIFICATION TESTING DEVICES FOR TRANSMITTING USER SELECTED DATA" in the names of Thomas J. Foth, Brian M. Romansky, Jeffrey D. Pierce, Andrei Obrea, and Anand V. Chhatpar; Ser. No. 10/430,922 filed herewith entitled "METHOD FOR FIELD PROGRAMMABLE RADIO FREQUENCY IDENTIFICATION DEVICES TO PERFORM SWITCHING FUNCTIONS" in the names of Andrei Obrea, Brian M. Romansky, Thomas J. Foth, Jeffrey D. Pierce, and Anand V. Chhatpar; U.S. Pat. No. 6,869,021 filed herewith entitled "METHOD FOR FIELD PROGRAMMING RADIO FREQUENCY IDENTIFICATION LABELS" in the names of Thomas J. Foth, Brian M. Romansky, Jeffrey D. Pierce, and Anand V. Chhatpar; and U.S. Pat. No. 6,840,444 filed herewith entitled "METHOD FOR FIELD PROGRAMMING RADIO FREQUENCY IDENTIFICATION RETURN FORMS" in the names of Jeffrey D. Pierce, Thomas F. Foth, Brian M. Romansky, Andrei Obrea, and Anand V. Chhatpar.

FIELD OF THE INVENTION

This invention pertains to electronic circuits and, more particularly, to programmable radio frequency identification devices.

BACKGROUND OF THE INVENTION

From the invention of paper thousands of years ago to the present date, paper has been used as the preferred medium by individuals and societies for the recording, processing and storing of information. With the introduction of computers into society, many of the functions previously performed exclusively with paper are now being accomplished by writing information on paper and entering the written information into a computer. Typically, the information written on paper is entered into computers by optically scanning the paper. The foregoing method of entering information into computers is inconvenient, because the paper must be placed directly on the scanner, and no intervening objects may be placed between the paper and the scanner. Another method utilized by the prior art for writing information on paper and entering the written information into a computer involved placing a piece of paper over an expensive digitizing pad and using a special pen that produced digital data by indicating the coordinates of the digitizing pad. Thus, heretofore, there was no economic, convenient way for wirelessly entering information written on plain paper into a computer.

Another method utilized by the prior art for entering information into a computer involved the use of radio frequency identification (RFID) tags. The RFID tags were programmed to contain digital information either during the manufacturing of the read only memory portion of the RFID integrated circuit, or in the field using electromagnetic radio frequency signals to store information in the nonvolatile memory portion of the RFID tag. One of the difficulties involved in the utilization of RFID tags was that if an end user wanted to enter information into the RFID tag, the end user had to use a specialized device that communicated with the RFID tag through a radio frequency. Another problem involved in the utilization of RFID tags that were programmed by the manufacturer was that the end user had to share the information that was going to be programmed into the RFID tag with the manufacturer of the tag.

Bar codes have been used in a wide variety of applications as a source for information. Typically, bar codes are used at a point-of-sale terminal in merchandising for pricing and inventory control. Bar codes are also used in controlling personnel access systems, mailing systems, and in manufacturing for work-in-process and inventory control systems, etc. The bar codes themselves represent alphanumeric characters by series of adjacent stripes of various widths or lengths, i.e., the Universal Product Code, Planet Code, etc.

A bar code is a set of binary numbers. It consists of black bars and white spaces. A wide black bar space signifies a one, and a thin black bar or space signifies a zero. The binary numbers stand for decimal numbers or letters. There are several different kinds of bar codes. In each one, a number, letter or other character is formed by a certain number of bars and spaces.

Bar code reading systems or scanners have been developed to read bar codes. The bar code may be read by having a light beam translated across the bar code and a portion of the light illuminating the bar code is reflected and collected by a scanner. The intensity of the reflected light is proportional to the reflectance of the area illuminated by the light beam. This light is converted into an electric current signal, and then the signal is decoded.

Conventional bar codes are limited in the amount of information they contain. Even two-dimensional bar codes, such as PDF-417 and Code -1, are limited to a few thousand bytes of information for practical uses. The ability to encode greater information density is limited by the resolution of available scanning and printing devices.

It is also difficult to create or change a bar code without using a printing device.

SUMMARY OF THE INVENTION

This invention overcomes the disadvantages of the prior art by providing a method that allows one to mark information with a pencil or conductive ink on a material equipped with a RFID type circuit, and have the marked information provide information to the RFID circuit, or have the written information cause the RFID circuit to perform some function. The material may be any cellulose type product, i.e., paper, cardboard, chipboard, wood or plastic, fabric, animal hide, etc. The marked entered information may be corrected by erasing the written information with a pencil eraser and writing new information on paper with a pencil. Information may also be marked into a RFID circuit or have the marked information cause the RFID circuit to perform some function by utilizing a standard ink jet computer printer to print lines on paper equipped with a RFID type circuit, by having the printed lines perform the function of wires. The aforementioned printed information may be modified by having an individual connect different printed wires by drawing a penciled line between the printed lines or by punching holes in the printed lines.

This invention accomplishes the foregoing by utilizing the RFID unique serial number generation portion of the RFID circuit that is used when the RFID circuit is being read. In the prior art, the bits used to encode one's and zero's into the generation portion of the RFID circuit were typically fixed. This invention utilizes the unique serial number generation portion of the RFID circuit by exposing on a piece of paper some or all of the bits left open or closed to represent binary values, i.e., ones or zeros. A user may complete the RFID unique serial number storage portion of the RFID circuit by filling in the space between the connections with a pencil to alter the binary values. Alternatively, the unique serial number generation portion of the RFID circuit may be exposed on a piece of paper with all of the connections made, and a user may break a space between the connections with a sharp instrument or hole punch to alter the binary values.

An additional advantage of this invention is that a RFID type circuit may be combined with marked information that is read by the RFID circuit, wherein the marked information also forms a bar code.

DETAILED DESCRIPTION OF THE PREFERRED EMBODIMENT

Figure 1:
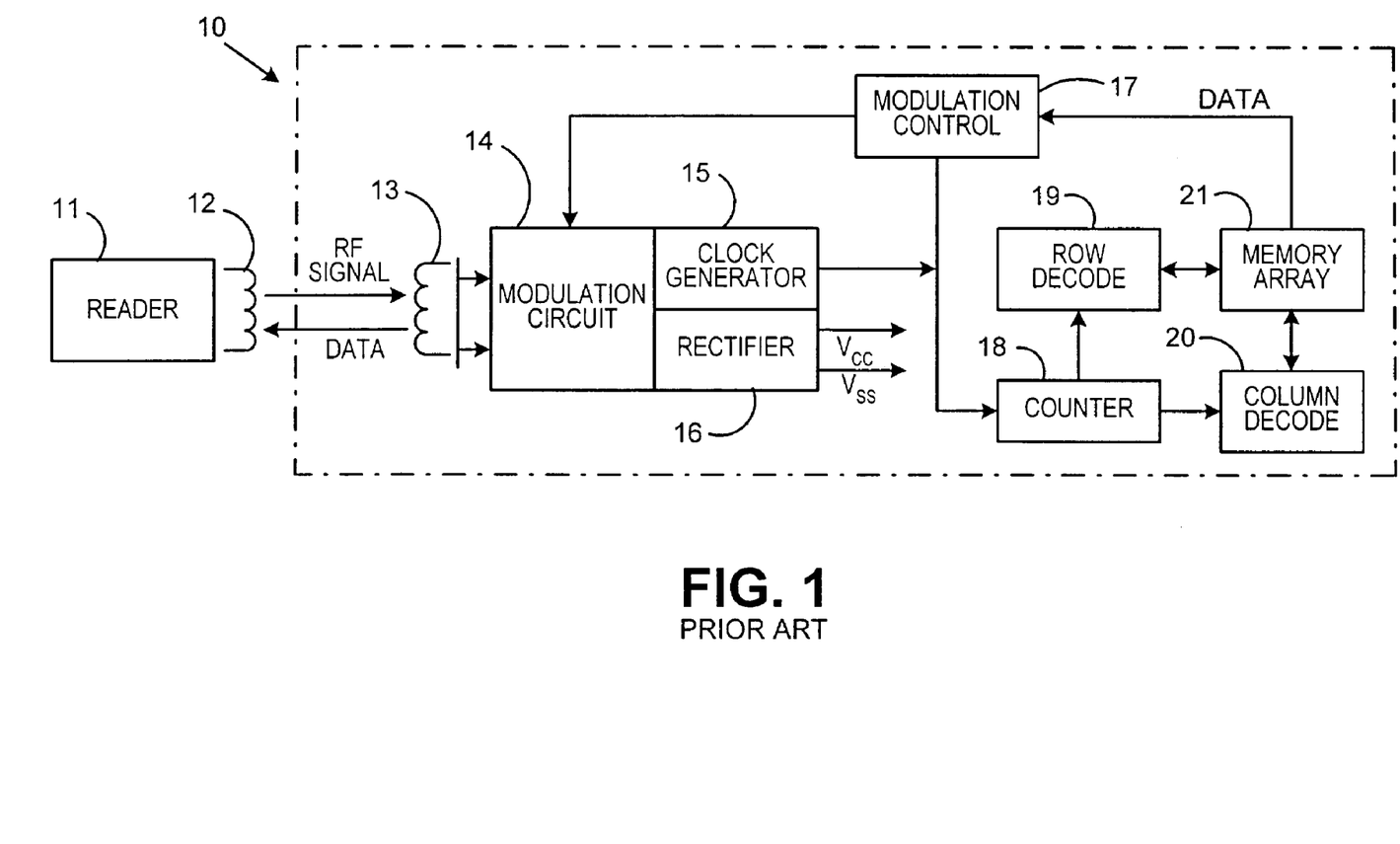
FIG. 1 is a block diagram of a prior art RFID circuit.

Referring now to the drawings in detail, and more particularly to FIG. 1, the reference character 10 represents a prior art RFID circuit. Circuit 10 may be the model MCRF 200 manufactured by Microchip Technology, Inc. of 2355 West Chandler Blvd, Chandler, Ariz. 85224. RFID reader 11 is connected to coil 12, and 12 is coupled to coil 13. Coil 13 is connected to modulation circuit 14. Modulation circuit 14 is connected to clock generator 15 and rectifier 16. Modulation control 17 is coupled to modulation circuit 14, clock generator 15 and counter 18. Counter 18 is coupled to column decode 20. Row decode 19 is coupled to memory array 21, and array 21 is coupled to modulation control 17. It would be obvious to one skilled in the art that a battery may be used to supply power to circuit 10.

Reader 11 has a transmitter mode and a receiver mode. During the transmit mode of reader 11, reader 11 transmits a radio frequency signal for a burst of time via coil 12. After the transmission of a signal by reader 11, reader 11 turns into a receiver. Coil 12 is inductively linked with coil 13, and coil 13 receives the radio frequency signal from coil 12 and converts the aforementioned signal into inductive energy, i.e., electricity. When coil 13 has sufficient energy, coil 13 will cause clock generator 15 to generate timing pulses which drive counter 18. Counter 18 drives row decode 19 which causes memory array 21 to read the fixed bit data pattern stored in memory array 21 one bit at a time. As the data bits are being read by array 21, the data bits are transmitted to modulation control circuit 17. Control circuit 17 sends the data bits to reader 11 via modulation circuit 14 and coils 13 and 12.

Figure 2A:
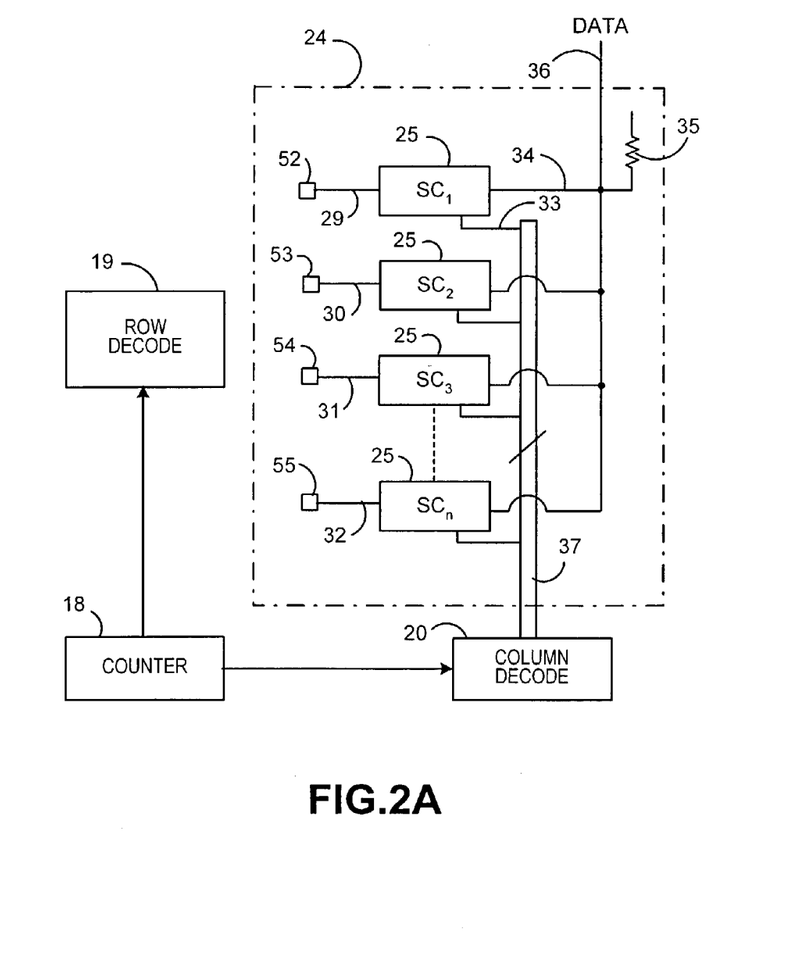
FIG. 2A is a drawing of a circuit 24 that replaces memory array 21 of FIG. 1 showing how programming of the bits may be accomplished by making the bits externally available for programming RFID circuit 10.

FIG. 2A is a drawing of a circuit 24 that replaces memory array 21 of FIG. 1 showing how programming of the bits may be accomplished by making the bits externally available for programming RFID circuit 10. A plurality of sensor circuits 25 is contained in circuit 24. Sensor circuits 25 are labeled $SC_1$ $SC_2$ $SC_3$ . . . $SC_n$. Line 29 is connected to $SC_1$ and graphite contact 52 and line 30 is connected to $SC_2$ and graphite contact 53. Line 31 is connected to $SC_3$ and graphite contact 54 and line 32 are connected to $SC_n$ and graphite contact 55. There is a sensor circuit 25 for each graphite contact. The description of FIG. 4 will describe how information may be entered into circuit 24 via graphite contacts 52–55. $SC_1$ has an input 33, which enables the data output 34. Input 33 is connected to one of the n lines 37, and data output 34 is connected to data line 36 and pull up resistor 35. Data line 36 is connected to modulation control 17 (FIG. 1).

When counter 18 selects the value 1, column decode 20 will enable line 33, which will cause the same logic level that is on graphite contact 52 to be placed on data output 34. When line 33 is not selected, the value on graphite contact 52 does not have any influence on the data output line 34. Enable outputs 33 for $SC_1$ . . . $SC_n$ are bundled together in lines 37 so that only one line 37 is turned on at a time. Lines 37 are connected to column decode 20. Column decode 20 is connected to counter 18, and counter 18 is connected to row decode 19. Counter 18 generates a sequence of numbers from 1 through n to enable a different line 37 in sequential order. Thus, data line 36 will receive the data outputs 34 from $SC_1$ . . . $SC_n$ at different times.

Figure 2B:
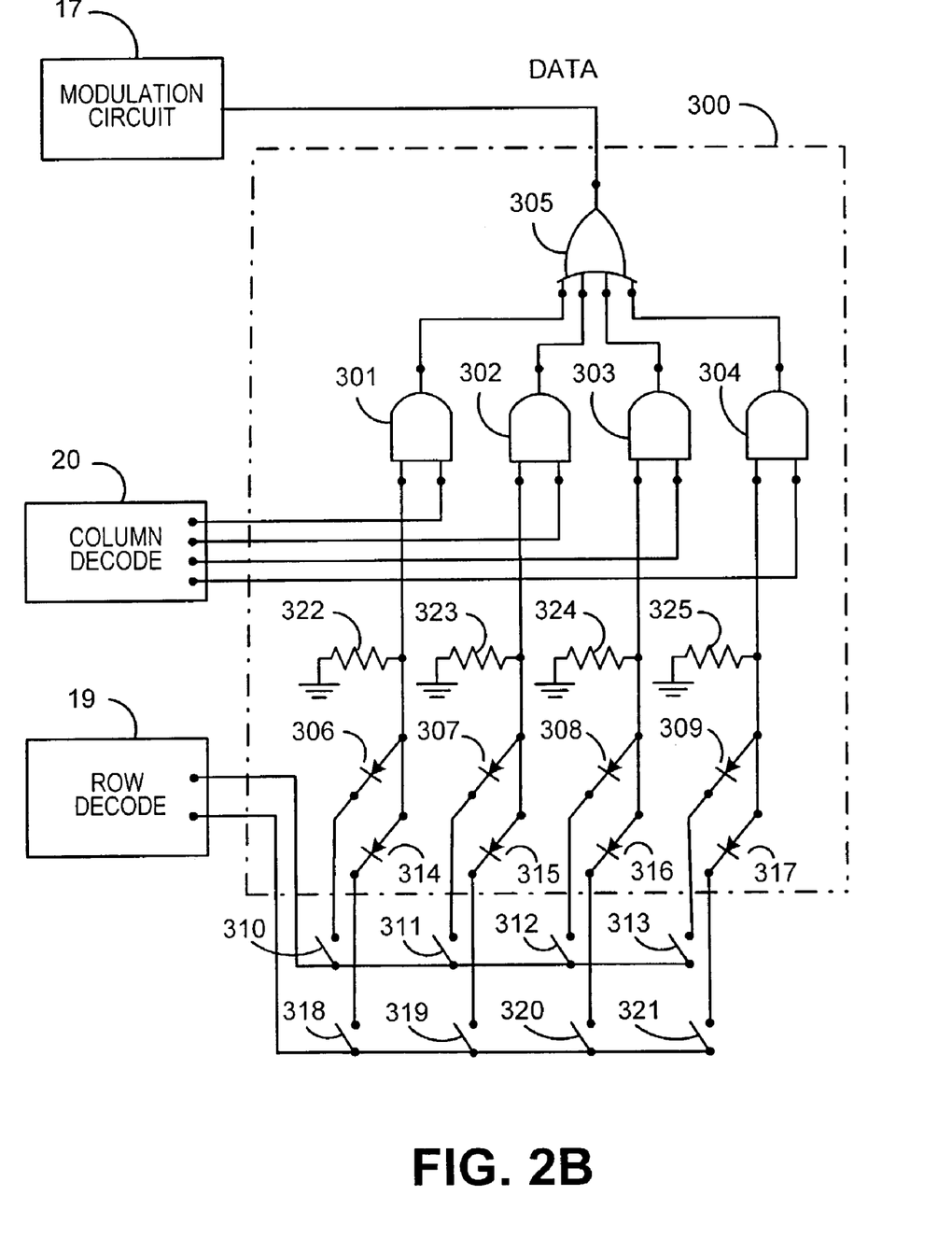
FIG. 2B is a drawing of a circuit 300 that is an alternate representation of circuit 24, that replaces memory array 21 of FIG. 1 showing how programming of the bits may be accomplished by making the bits externally available for programming RFID circuit 10.

FIG. 2B is a drawing of a circuit 300 that is an alternate representation of circuit 24, that replaces memory array 21 of FIG. 1 showing how programming of the bits may be accomplished by making the bits externally available for programming RFID circuit 10. Circuit 300 includes AND gates 301, 302, 303 and 304 and OR gate 305.

One of the inputs of AND gate 301 is connected to column decode 20 and the other input to AND gate 301 is connected to one of the ends of resistor 322, one of the ends of diode 306 and one of the ends of diode 314. The other end of resistor 322 is connected to ground. The other end of diode 306 is connected to one of the terminals of toggle switch 310, and the other end of toggle switch 310 is connected to row decode 19. The other end of diode 314 is connected to one of the terminals of toggle switch 318, and the other end of toggle switch 318 is connected to row decode 19.

One of the inputs of AND gate 302 is connected to column decode 20, and the other input to AND gate 302 is connected to one of the ends of resistor 323, one of the ends of diode 307 and one of the ends of diode 315. The other end of resistor 323 is connected to ground. The other end of diode 307 is connected to one of the terminals of toggle switch 311, and the other end of toggle switch 311 is connected to row decode 19. The other end of diode 315 is connected to one of the terminals of toggle switch 319, and the other end of toggle switch 319 is connected to row decode 19.

One of the inputs of AND gate 303 is connected to column decode 20, and the other input to AND gate 303 is connected to one of the ends of resistor 324, one of the ends of diode 308 and one of the ends of diode 316. The other end of resistor 324 is connected to ground. The other end of diode 308 is connected to one of the terminals of toggle switch 312, and the other end of toggle switch 312 is connected to row decode 19. The other end of diode 316 is connected to one of the terminals of toggle switch 320, and the other end of toggle switch 320 is connected to row decode 19.

One of the inputs of AND gate 304 is connected to column decode 20, and the other input to AND gate 304 is connected to one of the ends of resistor 325, one of the ends of diode 309 and one of the ends of diode 317. The other end of resistor 325 is connected to ground. The other end of diode 309 is connected to one of the terminals of toggle switch 313, and the other end of toggle switch 312 is connected to row decode 19. The other end of diode 317 is connected to one of the terminals of toggle switch 321, and the other end of toggle switch 321 is connected to row decode 19.

Column decode 20 and row decode 19 function by taking the selected output at logic one, i.e., a high level and keeping all the other outputs at logic zero, i.e., a low level. The output of AND gates 301–304 are connected to the input of OR gate 305, and the output of OR gate 305 is data that is connected to the input of modulation circuit 17. If switches 310, 311, 312 and 313, respectively, remain open, AND gates 301–304, respectively, will have a "zero" output. If switches 310, 311, 312 and 313, respectively, are closed, AND gates 301–304, respectively, will have a "one" output. The output of AND gates 301–304, respectively, will be read when switches 318–321, respectively, are closed.

Figure 3:
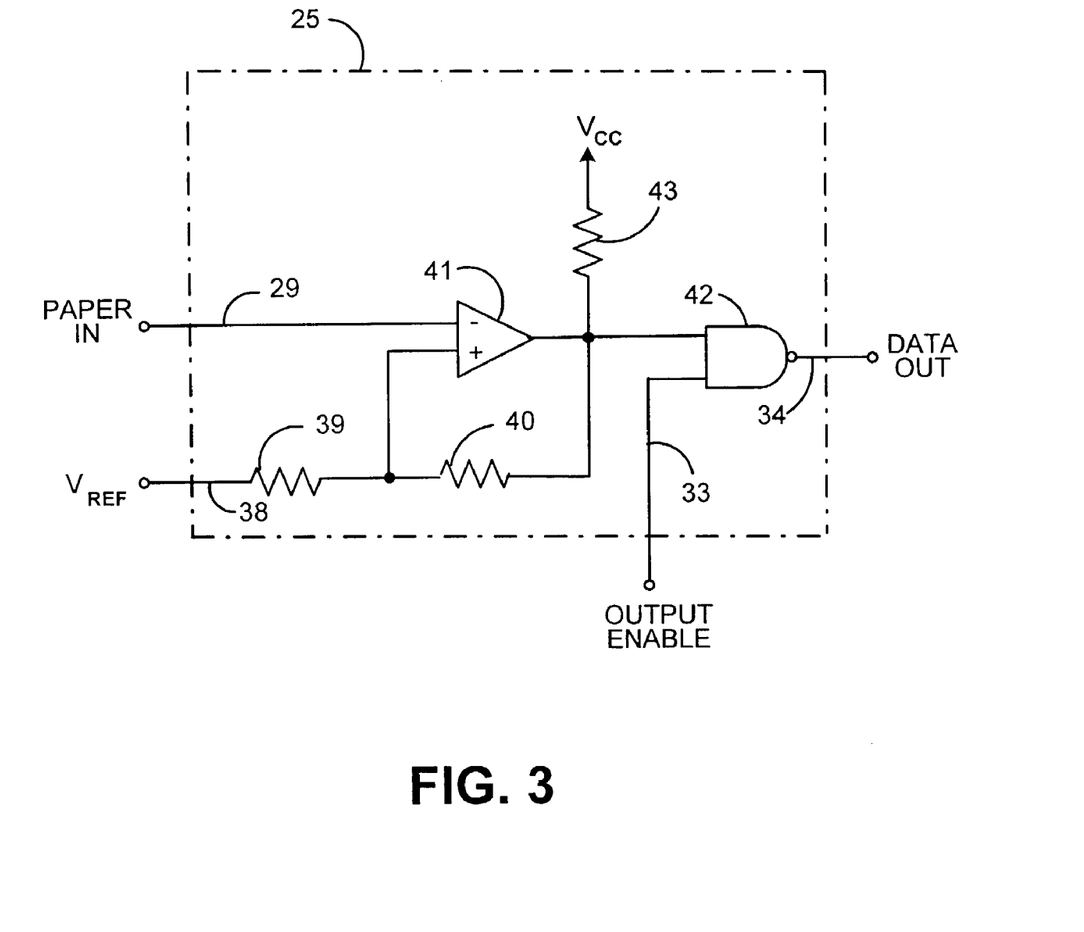
FIG. 3 is a drawing showing sensor circuit 25 of FIG. 2A in greater detail.

FIG. 3 is a drawing showing sensor circuit 25 of FIG. 2A in greater detail. The negative input of comparator 41 is connected to line 29, and the positive input of comparator 41 is connected to line 38. Comparator 41 may be a LM339N comparator. One end of line 38 is connected to a 2–3 volt reference voltage, and the other end of line 38 is connected to one of the ends of resistor 39. The other end of resistor 39 is connected to the positive input of comparator 41 and one of the ends of resistor 40. The other end of resistor 40 is connected to the input of NAND gate 42, the output of comparator 41 and one of the ends of resistor 43. The other end of resistor 43 is connected to a source voltage to act as a pull up resistor. The other input to NAND gate 42 is enable output 33. The output of gate 42 is data output 34. Resistor 39 may be 47,000 ohms, and resistor 40 may be 470,000 ohms. Resistor 43 may be 1,000 ohms. Comparator 41 has a positive feedback to provide a small amount of hysteresis Sensor circuit 25 is a differential circuit that accommodates variations in the conductivity of the conductive material. The conductive material may be used as a voltage divider to produce $V_{ref}$ on line 38 under the same conditions experienced by paper$_{in}$ on line 29. Thereby, nullifying the effects of varying resistance in the conductive material. It will be obvious to one skilled in the art that sensor circuit 25 may replace switches 310–313 and 318–321 of FIG. 2B.

Figure 4:
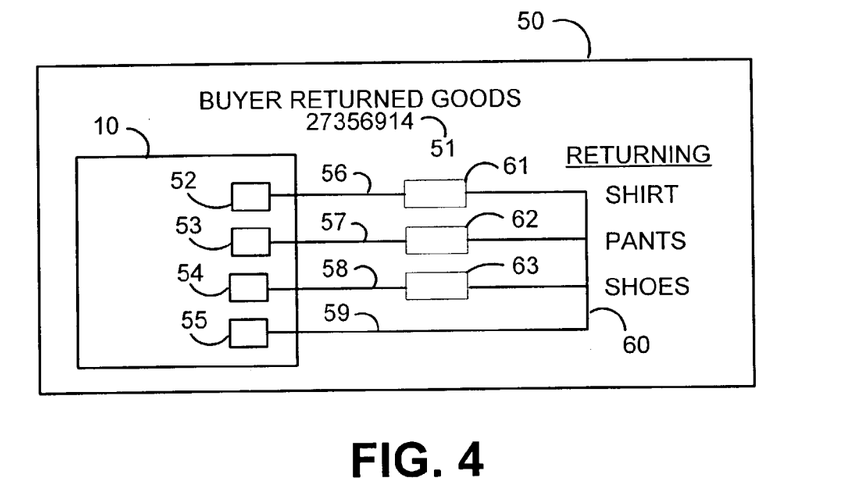
FIG. 4 is a seller furnished form to be completed by a buyer returning goods to a seller.

FIG. 4 is a seller-furnished form to be completed by a buyer returning goods to a seller. RFID circuit 10 is attached to paper 50 by means of a conductive adhesive such as an anisotropic adhesive (not shown). The adhesive connects copper contacts (not shown) exiting RFID circuit 10 with graphite contacts 52–55 which terminate in lines 56–58. A returned goods identification number 51 is placed on paper 50 to identify the buyer of the purchased goods. This number matches the identification number stored in RFID circuit 10. Graphite contacts 52, 53, 54 and 55 and lines 56, 57, 58, 59 and 60 are printed on standard bond paper, standard photocopier paper, standard computer paper, etc., by a standard computer printer like the model Desk Jet 880C printer manufactured by Hewlett Packard using a Hewlett Packard 45 black ink cartridge. The Hewlett Packard laser jet 1100 printer and its associated toner cartridge may also be used to print graphite contacts 52–55 and lines 56–60. It would be obvious to one skilled in the art that any conductive contacts may be used for the graphite contacts.

If the buyer decides to return a shirt to the seller, the buyer uses a graphite pencil, i.e., number 2, HB, etc., or a Paper Mate® black ball point pen to fill in rectangle 61. If the buyer decides to return pants to the seller, the buyer fills in rectangle 62 with a graphite pencil, and if the buyer decides to return shoes to the seller, the buyer fills in rectangle 63 with a graphite pencil. If the buyer changes his/her mind regarding the goods to be returned or makes a mistake in filling in one of the rectangles, the buyer could erase the penciled marking in the rectangle with a pencil eraser so that a RFID reader would only read what the buyer indicated on the finished form. The buyer would insert the finished form into a package (not shown) containing the returned goods, and the seller would be able to read the completed form when he/she receives the package with a RFID read without opening the package.

Figure 5:
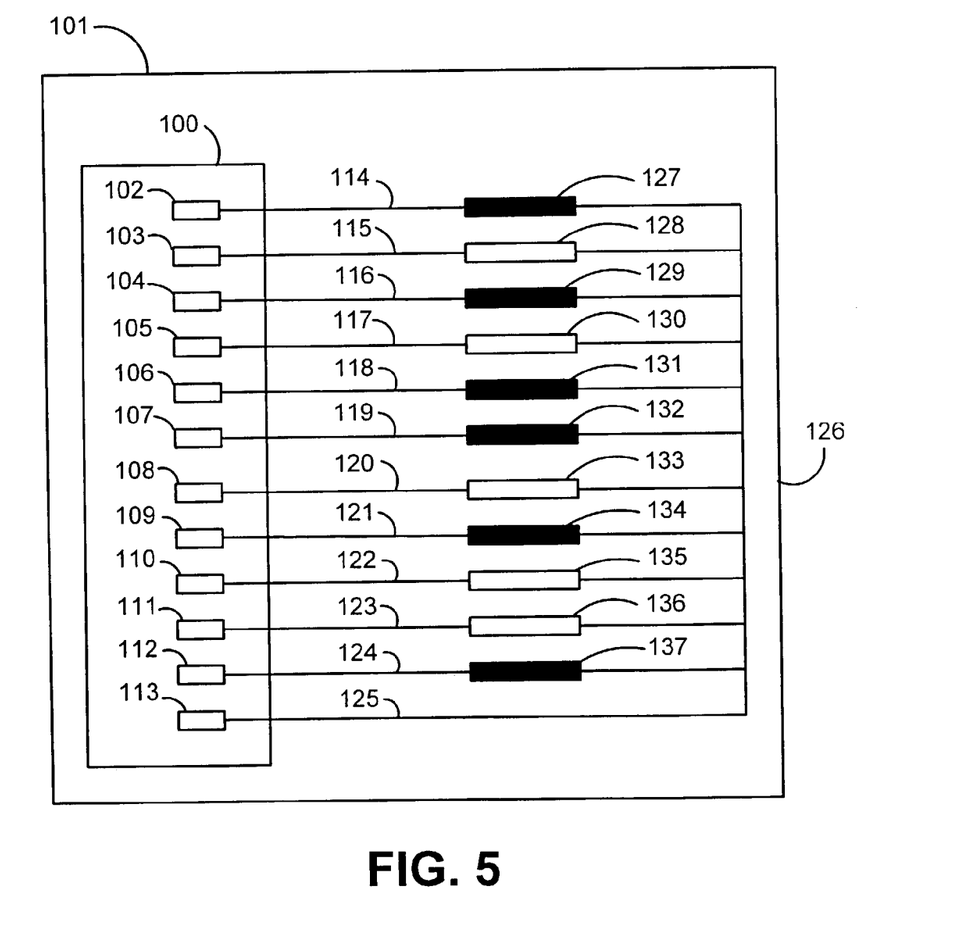
FIG. 5 is a drawing showing how a modified RFID circuit, attached to a piece of paper, provides information to the RFID circuit and how the user completed RFID circuit forms a bar code.

FIG. 5 is a drawing showing how a modified RFID circuit attached to a piece of paper provides information to the RFID circuit and how the user completed RFID circuit forms a bar code. RFID circuit 100 is attached to paper 101 by means of an anisotropic adhesive (not shown). The adhesive connects copper contacts (not shown) exiting RFID circuit 100 with graphite contacts 102–113 which terminate in lines 102–113 and lines 114–126. RFID circuit 100 is the same as RFID circuit 10 with circuit 24 replacing memory array 21 of FIG. 1 with different graphite contacts. Graphite contacts 102, 103, 104, 105 106, 107, 108, 109, 110, 111, 112 and 113 and lines 114–126 are printed on standard bond paper, standard photocopier paper, standard computer paper, etc., by a standard computer printer like the model Desk Jet 880C printer manufactured by Hewlett Packard using a Hewlett Packard 45 black ink cartridge. The Hewlett Packard laser jet 1100 printer and its associated toner cartridge may also be used to print graphite contacts 102–113 and lines 114–126.

If someone decided to use a graphite pencil, i.e., number 2, HB, etc., or a Paper Mate® black ballpoint pen to fill in rectangle 127, rectangle 127 would represent a binary one of a bar code, and a closed circuit will exist between contact 102, line 114, line 126, line 125 and contact 113. If someone decided not to use a graphite pencil, i.e., number 2 HB, etc., or a Paper Mate® black ballpoint pen to fill in rectangle 128, rectangle 128 would represent a binary zero of a bar code, and an open circuit will exist between contact 103, line 115, line 128, line 125 and contact 113. If someone decided to use a graphite pencil, i.e., number 2, HB, etc., or a Paper Mate® black ballpoint pen to fill in rectangle 129, rectangle 129 would represent a binary one of a bar code, and a closed circuit will exist between contact 104, line 116, line 126, line 125 and contact 113. If someone decided not to use a graphite pencil, i.e., number 2, HB, etc., or a Paper Mate® black ballpoint pen to fill in rectangle 130, rectangle 130 would represent a binary zero of a bar code, and an open circuit will exist between contact 105, line 117, line 126, line 125 and contact 113. It would be obvious to one skilled in the art if rectangles 131, 132, 134 and 137 were filed in with a graphite pencil, rectangles 131, 132, 134 and 137 would represent binary ones; and, if rectangles 133, 135, and 136 were not filed in with a graphite pencil, rectangles 133, 135, and 136 would represent binary zeros. The lines and contacts connecting rectangles 131, 132, 134 and 137 would be closed circuits, and the contacts connecting rectangles 133, 135, and 136 would be open circuits.

Figure 6:
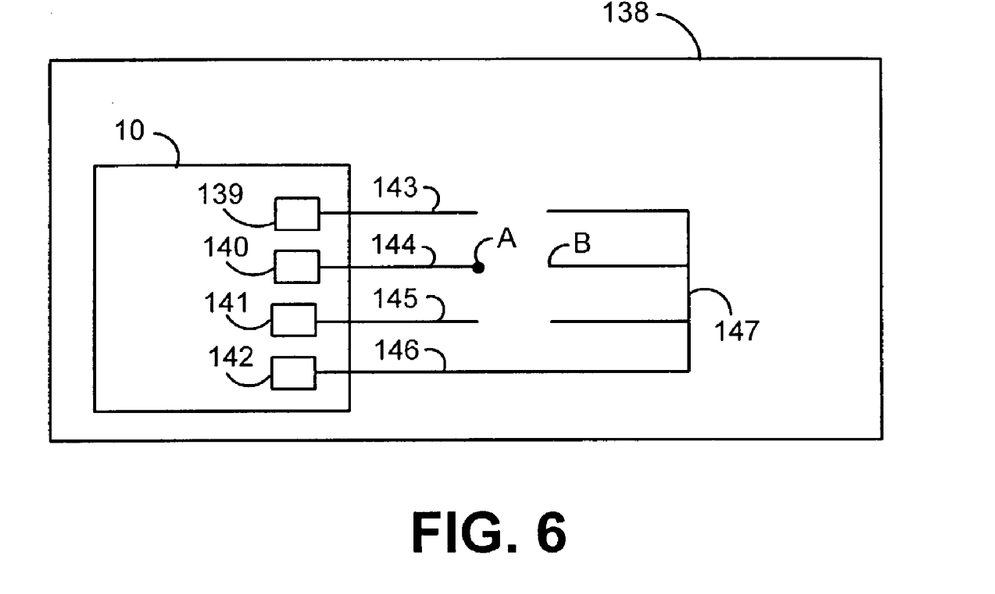
FIG. 6 is a drawing showing how a modified RFID circuit, attached to a piece of paper, may be touched by a human to indicate a desired selection.

FIG. 6 is a drawing showing how a modified RFID circuit attached to a piece of paper may be touched by a human to indicate a desired selection. RFID circuit 10 is attached to paper 138 by means of an anisotropic adhesive (not shown). The adhesive connects copper contacts (not shown) exiting RFID circuit 10 with graphite contacts 139–142, which terminate in lines 143–147. Graphite contacts 139, 140, 141 and 142 and lines 143, 144, 145, 146 and 147 are printed on paper 138 by a standard computer printer like the model Desk Jet 880C printer manufactured by Hewlett Packard using a Hewlett Packard 45 black ink cartridge. If a human user wanted to select the information represented by line 144, the user would place their finger between points A and B on line 144 which completes the circuit from graphite contact 140 to line 144 to line 147 to graphite contact 142. A RFID reader (not shown) will be able to read the above selection.

Figure 7:
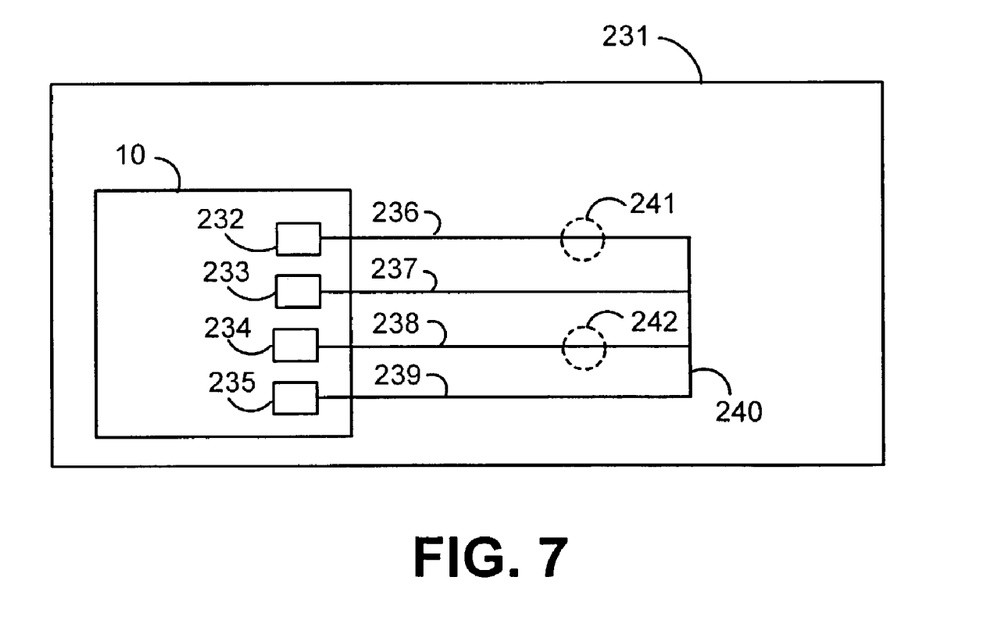
FIG. 7 is a drawing showing how a modified RFID circuit, attached to a piece of paper, presents information in the RFID circuit, and how holes punched in the RFID circuit forms a code that may be read by a optical reader.

FIG. 7 is a drawing showing how a modified RFID circuit attached to a piece of paper presents information in the RFID circuit. Holes may be punched in lines 236–238 altering the information represented in the RFID circuit 10. RFID circuit 10 is attached to paper 231 by means of an anisotropic adhesive (not shown). The adhesive connects copper contacts (not shown) exiting RFID circuit 10 with graphite contacts 232–235, which terminate in lines 236–240. Graphite contacts 232, 233, 234 and 235, and lines 236, 237, 238, 239 and 240 are printed on paper 231 by a standard computer printer like the model Desk Jet 880C printer manufactured by Hewlett Packard using a Hewlett Packard 45 black ink cartridge. If a human user wanted to select the information represented by line 236, the user would make a hole 241 on line 236, and if the user wanted to select the information represented on line 238, the user would make a hole 242 on line 238. Lines 239, 240 and 236, hole 241 and contact 232 will form an open circuit. Lines 238, 240 and 239, hole 242 and contact 234 will form an open circuit. Light may be passed through holes 241 and 242 to repeat the information represented by lines 236 and 238.

In some cases, an RFID circuit may be disabled by drawing a line, filling in a space, or punching a hole in a piece of paper to which the RFID circuit is coupled. The RFID circuit is changed by the resulting modification of its data bit or data bits so that the RFID circuit either does not respond to any interrogation, or responds only to certain interrogations. For example, the RFID circuit may be of the type such that it only responds to interrogations that are addressed to it, and the disabling action applied to the piece of paper may effectively change the address of the RFID circuit. An RFID circuit may be considered "disabled" when either it does not respond to any interrogation, or it does not respond to some interrogations while still being able to respond to other interrogations.

As used in the appended claims, "conductive lines" may include lines printed with conventional black ink or toner.

The above specification describes a new and improved circuit and RFID type circuit that uses printed lines to perform the function of wires so that information may be modified in the RFID type circuit by having an individual connect different printed wires by drawing a penciled line between the printed lines or by punching holes in the printed lines. It is realized that the above description may indicate to those skilled in the art additional ways in which the principles of this invention may be used without departing from the spirit. Therefore, it is intended that this invention be limited only by the scope of the appended claims.

What is claimed is:

1. A apparatus for entering information into a radio frequency identification circuit, said apparatus comprises:
   a plurality of electric contacts;
   a plurality of differential circuits, wherein each of said differential circuits are coupled to one of said plurality of contacts; and
   means coupled to each of said differential circuits for converting the information sensed by each of said differential circuits into individual binary bits and to nullify the effects in variations in resistance of the conductive material.

2. The apparatus claimed in claim 1, wherein the differential circuits sense the information marked with a pencil.

3. The apparatus claimed in claim 1, wherein the information is made by a pencil.

* * * * *